(12) United States Patent
Lee et al.

(10) Patent No.: US 11,145,568 B2
(45) Date of Patent: Oct. 12, 2021

(54) MAGNETICALLY AFFIXED HEAT SPREADER

(71) Applicant: Intel Corporation, Santa Clara, CA (US)

(72) Inventors: Jaejin Lee, Beaverton, OR (US); Hao-Han Hsu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 112 days.

(21) Appl. No.: 16/215,228

(22) Filed: Dec. 10, 2018

(65) Prior Publication Data

US 2019/0115281 A1 Apr. 18, 2019

(51) Int. Cl.
*H01L 23/40* (2006.01)
*H01F 7/02* (2006.01)
*H01L 23/427* (2006.01)
*H01L 23/42* (2006.01)

(52) U.S. Cl.
CPC .......... *H01L 23/40* (2013.01); *H01F 7/0252* (2013.01); *H01L 23/427* (2013.01); *H01L 23/42* (2013.01); *H01L 2224/73253* (2013.01)

(58) Field of Classification Search
CPC ............... H01L 23/40; H01L 23/427; H01L 2224/73253; H01L 23/42; H01L 23/46; H01L 23/36–4735; H01F 7/0252; H05K 7/20254; H05K 7/205; H05K 7/20509
USPC ........................................ 361/702, 704, 711
See application file for complete search history.

(56) References Cited

U.S. PATENT DOCUMENTS

| | | | |
|---|---|---|---|
| 2008/0273308 A1* | 11/2008 | Kells ...................... | H01L 23/40 361/704 |
| 2012/0014068 A1* | 1/2012 | Nakanishi ............... | H01L 23/40 361/717 |
| 2012/0120608 A1* | 5/2012 | Guan .................. | H05K 7/20172 361/704 |
| 2012/0256509 A1* | 10/2012 | Lee ...................... | H02K 1/2773 310/156.53 |
| 2014/0020863 A1* | 1/2014 | Hawwa .................... | H01L 23/40 165/67 |
| 2014/0085796 A1* | 3/2014 | Mathew .................... | G06F 1/16 361/679.21 |
| 2014/0174705 A1* | 6/2014 | Chang ................. | H01L 23/3672 165/185 |
| 2015/0160701 A1* | 6/2015 | Bruno ................... | H01L 23/367 361/679.31 |
| 2015/0262907 A1* | 9/2015 | Degner .................. | H05K 1/181 361/679.47 |
| 2016/0021791 A1* | 1/2016 | Bosak ..................... | F28D 15/04 165/104.21 |
| 2019/0150321 A1* | 5/2019 | Hirai .................. | H05K 7/20736 361/699 |
| 2020/0260617 A1* | 8/2020 | Madanipour ...... | H05K 7/20736 |

* cited by examiner

*Primary Examiner* — Stephen S Sul
(74) *Attorney, Agent, or Firm* — Patent Capital Group

(57) ABSTRACT

There is disclosed in one example a computing apparatus, including: an active computing element; a first magnetic attractor mechanically coupled to the active computing element; and a cold plate disposed to conduct heat away from the active computing element, the cold plate including a second magnetic attractor disposed to magnetically couple with the first magnetic attractor.

25 Claims, 7 Drawing Sheets

MAGNETICALLY AFFIXED HEAT SPREADER

FIELD OF THE SPECIFICATION

This disclosure relates in general to the field of thermal engineering, and more particularly, though not exclusively, to a system for providing a magnetically affixed heat spreader.

BACKGROUND

A modern system on a chip may include a multicore processor operating at several gigahertz (GHz), along with support circuitry including a chipset, communication elements, and other elements such as network controllers, interface controllers, and local interconnect controllers. All of these elements generate substantial heat. Thus, central processing units (CPUs), systems-on-a-chip (SoCs), and other discrete processing elements may use a number of thermal management techniques, including fans, heat spreaders, thermal paste, liquid cooling, and others.

BRIEF DESCRIPTION OF THE DRAWINGS

The present disclosure is best understood from the following detailed description when read with the accompanying FIGURES. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

EMBODIMENTS OF THE DISCLOSURE

Figure 1:
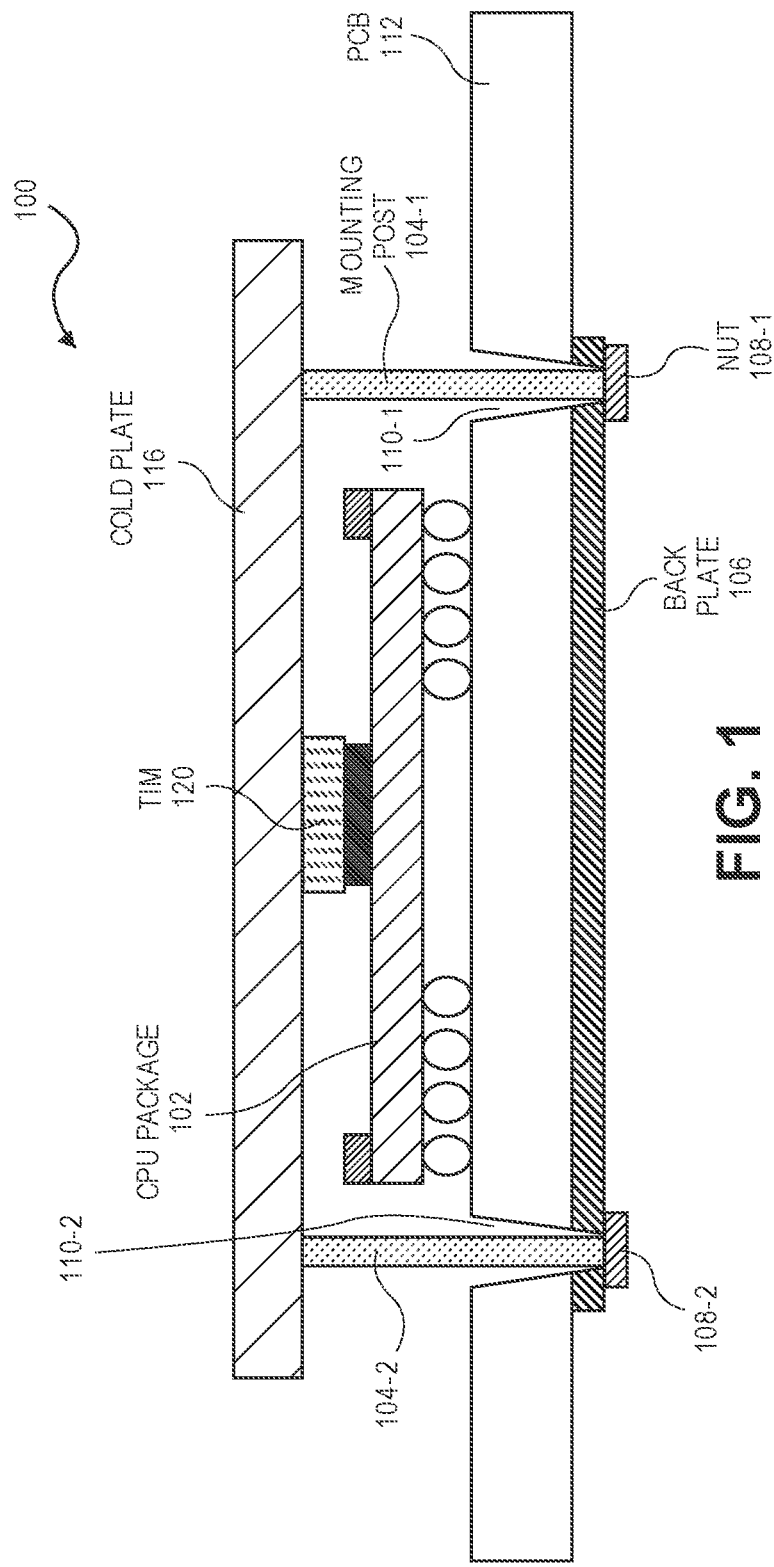
FIG. 1 is a block diagram illustration of a thermal management system.

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different FIGURES. This repetition is for the purpose of simplicity and clarity and does not in itself dictate a specific relationship between the various embodiments and/or configurations discussed. Different embodiments may have different advantages, and no particular advantage is necessarily required of any embodiment.

A contemporary computing platform may include a complex and multi-faceted hardware platform provided by Intel®, another vendor, or combinations of different hardware from different vendors. For example, in a large data center such as may be provided by a cloud service provider (CSP) or a high-performance computing (HPC) cluster, the hardware platform may include rack-mounted servers with compute resources such as processors, memory, storage pools, accelerators, and other similar resources. As used herein, "cloud computing" includes network-connected computing resources and technology that enables ubiquitous (often worldwide) access to data, resources, and/or technology. Cloud resources are generally characterized by flexibility to dynamically assign resources according to current workloads and needs. This can be accomplished, for example, by assigning a compute workload to a guest device, wherein resources such as hardware, storage, and networks are provided to a virtual machine, container, or disaggregated node by way of nonlimiting example.

In embodiments of the present disclosure, a processor may include any programmable logic device with an instruction set. Processors may be real or virtualized, local or remote, or in any other configuration. A processor may include, by way of nonlimiting example, an Intel® processor (e.g., Xeon®, Core™, Pentium®, Atom®, Celeron®, x86, or others). A processor may also include competing processors, such as AMD (e.g., Kx-series x86 workalikes, or Athlon, Opteron, or Epyc-series Xeon workalikes), ARM processors, or IBM PowerPC and Power ISA processors, to name just a few.

Commonly used heat spreader designs may include a post with a threaded end to receive a nut. The post, which is mechanically affixed to the heat spreader, passes through holes on the printed circuit board (PCB) of a motherboard and receives nuts to secure the posts on the opposite side of the PCB. This configuration securely affixes the heat spreader to the central processing unit (CPU) or other processing element. A heat spreader may then be used in conjunction with other thermal management techniques, such as fans, thermal paste, or other cooling mechanisms to cool active circuit elements.

One disadvantage to such a configuration is that the through holes in the PCB required to affix the heat spreader to the CPU often pass through the so-called keep out zone (KOZ) near the CPU. The KOZ is an area of dense routing, because it carries signals out from the CPU to other elements of the system. Because of the dense routing requirements, space is at a premium in the KOZ. It is therefore disadvantageous to drill through holes in this area of the PCB, as such through holes need to be large enough both to allow the posts to pass through, and to ensure that there is sufficient insulation between the posts, nuts, and active circuit elements. Furthermore, this configuration requires mechanical assembly of screws, backplate, and retention arms to align and hold the thermal solution over the CPU or SoC. A mechanical assembly may also be required to maintain the required thermal contact force over the CPU or SoC. Another issue with this configuration is the desired "z-height." As devices become thinner, and vertical space becomes a premium design consideration, it is desirable to provide thermal solutions that minimize the necessary z-height.

The present specification provides an improved thermal solution, in which a magnetically affixed heat spreader draws heat away from the CPU or SoC without requiring through holes or mechanical assemblies. As SoC packages become thinner, they lose structural integrity. Many SoCs therefore already require a metallic mechanical stiffener to provide structural integrity. Advantageously, because it is metallic, this mechanical stiffener has magnetic and electrical properties. Specifically, the metallic stiffener can be manufactured of a material that is passively magnetic. A heat spreader can then be manufactured with one or a plurality of magnets disposed around the periphery to attract the mechanical stiffener. This can include, in one embodiment, a plurality of small neodymium magnets dispersed around the periphery. A plurality of small magnets is useful in this embodiment because each magnet has a relatively small cross-section. While a single magnet could be used, it may be inappropriate for some embodiments, because the magnetic force is dispersed over a wider area. A larger number of small neodymium magnets has been found to provide sufficient magnetic attraction to secure the heat spreader to the SoC or CPU package assembly. This means that there is no need for through holes within the KOZ of the PCB, and there is no need for mechanical assembly of screws and nuts.

The heat spreader described in this specification realizes heat dissipation similar to or even exceeding that of a heat spreader affixed by mechanical means such as posts and screws, while simplifying assembly, reducing costs, eliminating screw holes in the KOZ of the PCB, and providing a reduced z-profile.

A system and method for providing a magnetically affixed heat spreader will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

FIG. 1 is a block diagram illustration of a thermal management system 100. Thermal management system 100 could be an example of an existing thermal management system, or thermal management system 100 could be adapted to use the teachings of the present specification, such as by including magnets on cold plate 116.

In an embodiment where thermal management system 100 is designed according to known design principles, cold plate 116 may require mechanical assembly of screws on mounting post 104, backplate 106, and retention arms of mounting post 104 to align and hold cold plate 116 over CPU package 102. Note that CPU package 102 is disclosed as an illustrative example of an active element that may require a thermal solution. But CPU package 102 should be understood as a nonlimiting example. Examples of other active elements that may require a thermal solution include an application-specific integrated circuit (ASIC), a digital signal processor (DSP), a system on a chip (SoC), a graphics processing unit (GPU), or any other controller or active circuitry. The teachings of the present specification should be understood to be broadly applicable to any computing element that requires a thermal solution.

Cold plate 116 may be a conductive thermal element, such as a metal plate, that is designed to draw heat away from CPU package 102 and vent it out to an ambient environment. Cold plate 116 may affix to CPU package 102 via a thermal interface material (TIM) 120. This could be, for example, a thermal paste or similar.

Mounting posts 104-1 and 104-2 are illustrated, and other mounting posts may be provided. For example, commonly four mounting posts are provided on a rectangular cold plate 116. Mounting posts 104 may include retention arms and screw elements that are configured to receive a nut. For example, nut 108-1 may affix to a screw element of mounting post 104-1, while nut 108-2 may affix to a screw element of mounting post 104-2. When mounting posts 104 and nuts 108 are mechanically assembled, cold plate 116 is held firmly against TIM 120, which secures the assembly to CPU package 102. Heat that dissipates from CPU package 102 is conducted onto cold plate 116, and from cold plate 116 may be conducted out to an ambient environment such as via a heat pipe and/or fans.

To allow mounting post 104 to secure to backplate 106, through holes may be drilled through PCB 112. Specifically, mounting post 104-1 mounts through through hole 110-1, and mounting post 104-2 mounts through through hole 110-2. Through holes 110 are drilled through PCB 112 and backplate 106, thus allowing mounting posts 104 to be secured to backplate 106 via nuts 108.

Because of the spatial proximity of cold plate 116 to CPU package 102, through holes 110 are also located close to CPU package 102. This may mean that through holes 110 have to be drilled through PCB 112 within the keep out zone (KOZ). Because the KOZ is dense with circuitry to carry signals to and from CPU package 102, space within the KOZ is at a premium. The mechanical considerations of cold plate 116 and mounting posts 104 dictate that through holes 110 be drilled near the KOZ.

Furthermore, the use of mounting posts 104 on cold plate 116 also increases the mechanical assembly cost of the system, as well as increasing the vertical ("z-axis") profile.

Figure 2:
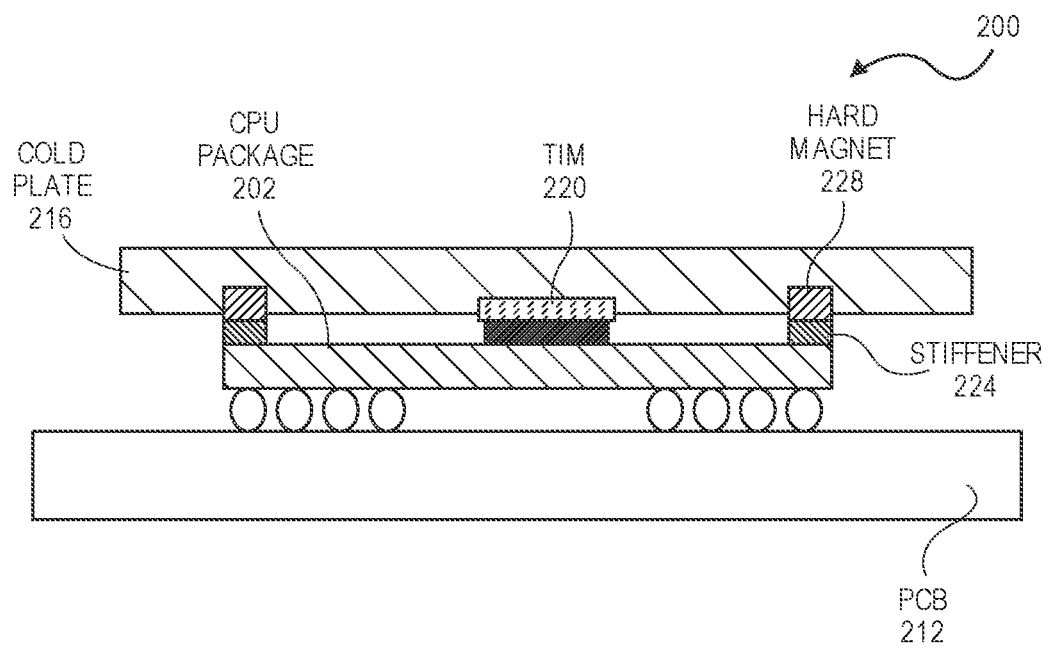
FIG. 2 is a further block diagram illustration of a thermal management system.

FIG. 2 is a block diagram illustration of a thermal management system 200. It may be noted in connection with FIG. 2 that as the thickness of SoC packages decreases, a metal stiffener may be required to mitigate package mechanical warpage. The mechanical stiffener may be made of steel or some other metal. Advantageously, the steel or other metal has both electrical conductivity and good passive magnetic properties.

Because of these passive magnetic properties of stiffener 224, it is possible to make a magnetically self-aligned thermal solution by a combination of the passive magnetic properties of stiffener 224 and strong, hard magnets 228 on cold plate 216.

As before, CPU package 202 may be soldered to PCB 212, and have a TIM 220 disposed between cold plate 216 and CPU package 202. Note, however, that PCB 212 may not require a backplate as in system 100 of FIG. 1, because there are no mounting posts or through holes through PCB 212.

The large magnetic attractive force between hard magnets 228 and stiffener 224 can be produced along the package peripheral between CPU package 202 and cold plate 216. It should be noted that cold plate 216 may be only one element of a comprehensive thermal solution.

Because the elements here are magnetically self-aligned, assembly is simplified by eliminating mechanical assembly for PCB 212. This saves substantial two-dimensional (X-Y) PCB area, as compared to the previous approach that drills through holes through the KOZ of the PCB 212.

In thermal management system 200, mechanical screws and holes are removed, along with the backplate. The KOZ of PCB 212 is freed up, thus relaxing PCB routing constraints and improving PCB routing flexibility. It should be noted that the illustrated thermal management system is much more easily manufactured than thermal management system 100 of FIG. 1. Furthermore, because of the relaxed routing requirements, PCB 212 may be smaller in some cases than PCB 112 for a similar amount of routing. A smaller PCB allows more space for batteries, thereby increasing battery capacity for the overall system. In recent trends, small PCBs are in high demand to increase battery capacity. In some applications, greater than 80% of the system area is occupied by the battery, while less than 20% of the area is allowed for the PCB.

Figure 3:
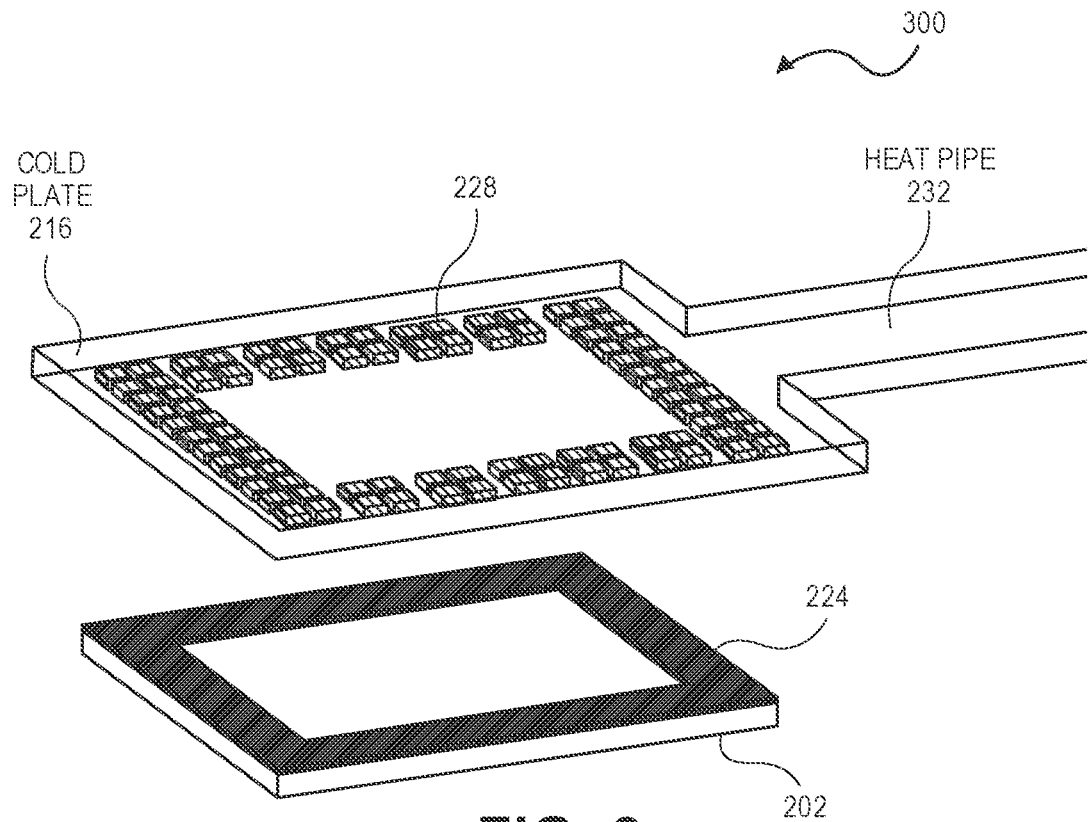
FIG. 3 is a perspective view of a magnetically affixed heat spreader.

FIG. 3 is a perspective view of a magnetically affixed heat spreader 300. Heat spreader 300 may embody some elements of thermal management system 200 of FIG. 2, or may include other elements. In some cases, thermal management system 200 and heat spreader 300 may be considered a single element.

Visible in FIG. 3 is CPU package 202 with stiffener 224. Stiffener 224 may be a soft magnet, and may be disposed around the periphery of CPU package 202. Note that in addition to providing magnetic and electrical properties, mechanical stiffener 224 also helps to prevent warpage of CPU package 202, which is an issue as the thickness or z-profile of CPU package 202 is reduced.

Cold plate 216 is substantially rectangular in construction, and may be manufactured to approximate the dimensions of CPU package 202, or may be slightly larger than CPU package 202.

Hard magnets 228 are disposed in an array around the periphery of cold plate 216. Hard magnets 228 may be disposed so as to strongly magnetically influence stiffener 224, which may be passively magnetic. Note that in this embodiment, an array of small hard magnets 228 is used instead of a single large magnet around the periphery of cold plate 216. The use of several small magnets creates a number of strong independent magnetic fields that attract stiffener 224, thus increasing the overall magnetic attraction between magnets 228 and stiffener 224. Note, however, that if a sufficiently strong magnetic field were developed, then a single magnet around the periphery of cold plate 216 could also be used.

To achieve good thermal conductivity of the thermal interface material (TIM), sufficient normal force ($F_z$) is required. In an example application, greater than 15 foot-pounds of force is required for an illustrative SoC. In this illustrative example, to demonstrate the feasibility of the magnetically self-aligned solution, a simulation was performed. A three-dimensional Maxwell computational simulation was used to estimate the achievable force. The simulation used an SoC package with dimensions of approximately 32 millimeters (mm)×44 mm, with a steel 1008 stiffener. The magnets were neodymium iron 35 hard magnets on cold plate 216. The magnetic tile structure of hard magnets 228 was designed both to realize large normal magnetic force, and to ensure mechanical robustness. In other words, a tiled structure is more difficult to break than a single unibody structure. Applying these principles to a system similar to the one illustrated in FIG. 3, approximately 16 foot-pounds of uniform normal force was realized along the package peripheral without conventional mechanical assembly steps.

Figure 4:
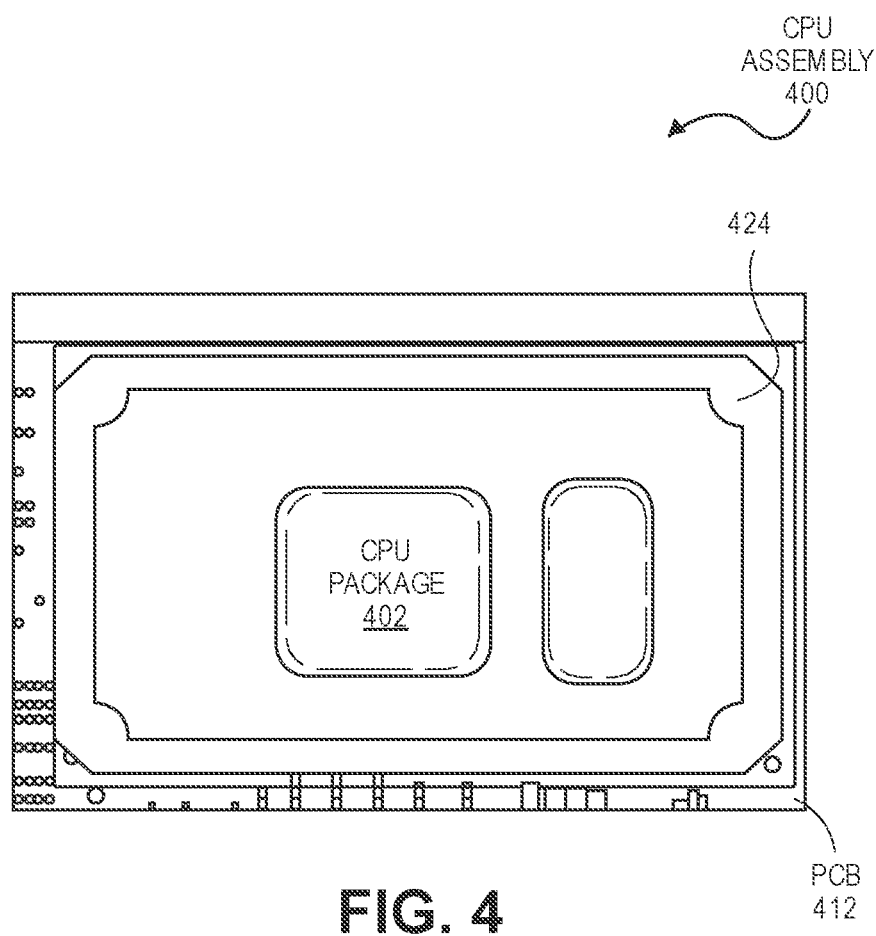
FIG. 4 is a top view of an illustrative central processing unit (CPU) assembly.

FIG. 4 is a top view of an illustrative central processing unit (CPU) assembly 400. CPU assembly 400 includes a CPU package 402, with a mechanical stiffener 424 mounted (e.g., soldered) to a PCB 412. CPU assembly 400 may realize substantial processing power, but as discussed herein, may generate substantial heat. Thus, a thermal solution such as heat spreader of 300 may be used to draw heat away from CPU package 402 and vent it out, via a heat pipe 232 or similar, to an ambient environment.

Figure 5:
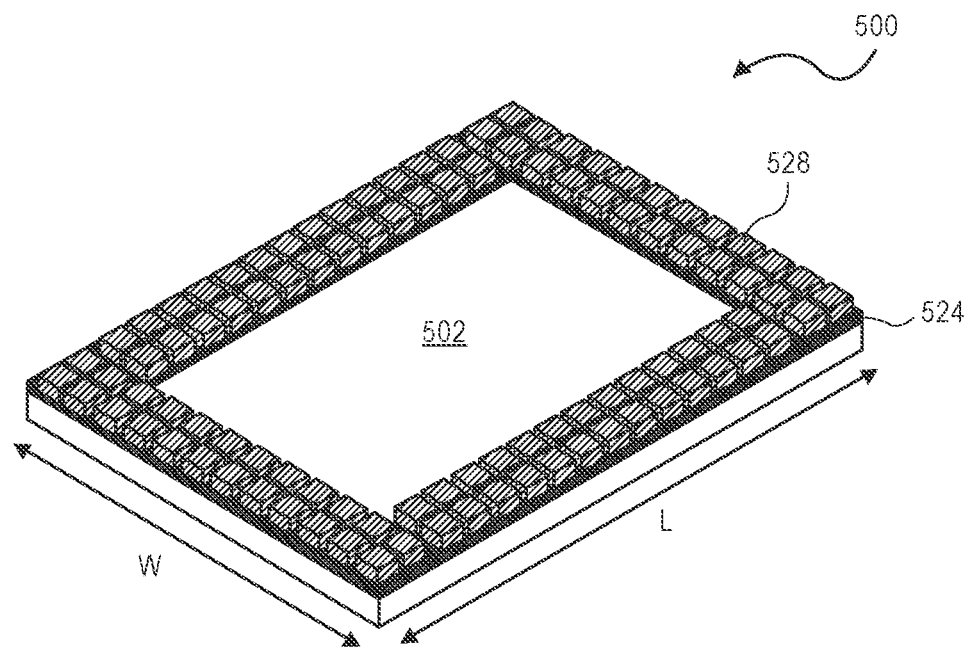
FIG. 5 is a perspective view of an example thermal solution.

FIG. 5 is a perspective view of an example thermal solution 500. Thermal solution 500 illustrates a relationship between CPU package 502, mechanical stiffener 524, and magnets 528. In this illustration, mechanical stiffener 524 is disposed over and along the periphery of CPU package 502. An array of hard magnets 528 is disposed, for example, within a cold plate, and positioned so as to lie substantially directly over mechanical stiffener 524. In this example, magnets 528 are permanent magnets, while mechanical stiffener 524 is passively magnetic. However, other configurations are possible. For example, an array of magnets could be placed on CPU package 502, and the cold plate could be passively magnetic. In particular, this may be practical in cases where CPU package 502 does not require the support of mechanical stiffener 524. Furthermore, magnets 528 could be a single large magnet of approximately the same shape and size as mechanical stiffener 524.

To achieve good thermal conductivity of the thermal interface material, there must be sufficient normal force ($F_z$) between magnets 528 and mechanical stiffener 524. In one illustrative embodiment, the force should be greater than 15 foot-pounds. In one example, CPU package 502 has dimensions of approximately 32 mm×44 mm. This should be noted as only a single illustrative example, and is provided only to illustrate the teachings of the present specification. Any suitable size of CPU package or other active element may be used. In this example, mechanical stiffener 524 is made of steel 1008.

Hard magnets 528 are NdFe35 hard magnets, and have dimensions of approximately 2 mm wide, 2 mm long, and 1 mm thickness. This provides a magnet aspect ratio ($A_z$=T/W) of 1 mm/2 mm, or 0.5. This relatively low magnet aspect ratio helps to ensure a strong $F_z$ develops between each magnet 528 and mechanical stiffener 524.

In this example, mechanical stiffener 524 is a steel 1008 stiffener with a width of approximately 5 mm, and other dimensions substantially matching the dimensions of CPU package 502 (e.g., 32 mm×44 mm). The thickness of mechanical stiffener 524 is approximately 0.3 mm.

In simulation, this configuration was found to develop approximately 16 foot-pounds of uniform normal force along the package periphery without conventional mechanical assembly necessary.

Figure 6:
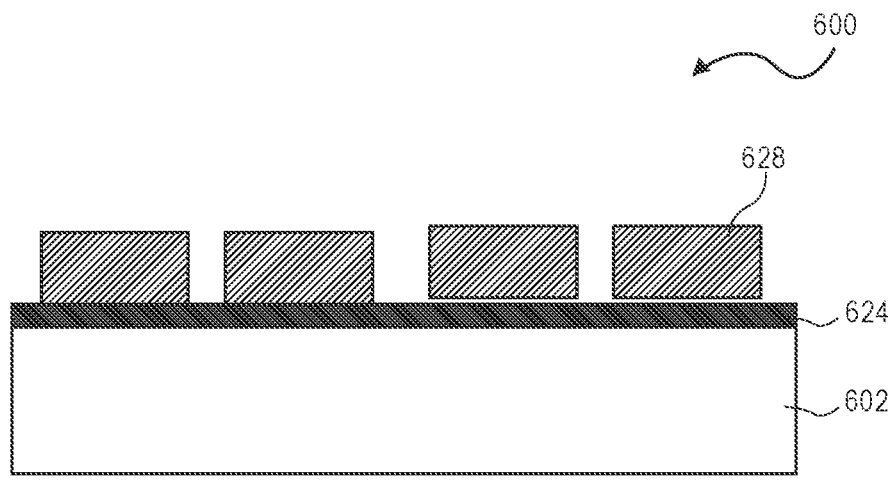
FIG. 6 is a side view of selected elements of a thermal solution.

FIG. 6 is a side view of selected elements of a thermal solution 600. Thermal solution 600 may be an example or embodiment of the thermal solutions of any of the previous illustrations, or may be a separate thermal solution.

Thermal solution 600 includes a CPU package 602, a stiffener 624, and hard magnets 628.

It should be noted that embodiments of the present specification may be rated to a shock force on the order of 5 foot-pounds, which is about 30% of the total static force of 15 to 16 foot-pounds. Thus, shock performance is not a major issue when an array of hard magnets 628 is used.

Thermal solution 600 also illustrates the tolerances of variations that may be expected according to manufacturing process variations. For example, in the illustrative example where mechanical stiffener 624 has dimensions of 32 mm×44 mm×5 mm width and 0.3 mm thickness, process variations may result in mechanical variations of approximately 100 μm. In other words, stiffener 624 may have a flatness with variations up to approximately 100 μm. Illustrated in this FIGURE is that some hard magnets 628 may not make full contact with stiffener 624 because of these process variations.

However, simulations have determined that in this configuration, a sufficient normal force of 14.6 foot-pounds is achieved when up to 20% of the magnets have a gap space of up to 100 μm from stiffener 624 as illustrated in FIG. 6. Thus, thermal solution 600 achieves acceptable adherence even in the presence of normal process variations in the manufacture of stiffener 624.

Figure 7:
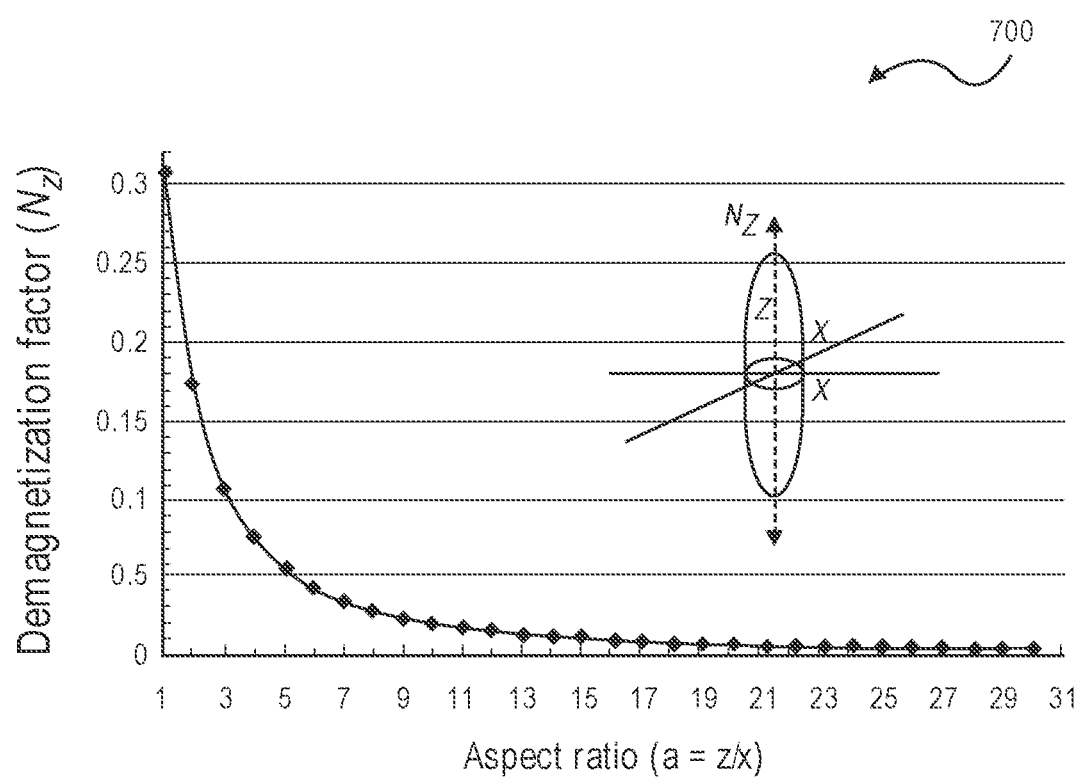
FIG. 7 is a graph illustrating the relationship between the magnet aspect ratio and the demagnetization factor.

FIG. 7 is a graph 700 illustrating the relationship between the magnet aspect ratio and the demagnetization factor. The x-axis of graph 700 is aspect ratio a=z/x, or in other words, the ratio of the thickness to the width. Demagnetization factor $N_z$ is a unitless factor.

As the vertical aspect ratio a=z/x increases, the normal magnetic field $H_Z$ can substantially increase by lowering demagnetization factor $N_Z$ along the vertical direction.

These calculations can take the form of:

$$H_Z = 4\pi M(1 - N_Z)$$

$$N_Z = \frac{1}{(r^2 - 1)}\left[\frac{r}{\sqrt{r^2 - 1}}\ln(r + \sqrt{r^2 - 1}) - 1\right]$$

$$\text{Aspect ratio, } r = \frac{z}{x}(>1)$$

$N_Z$: demagnetization factor
M: magnetization
$H_Z$: magnetic field
$\mu_{eff, z}$: effective permeability As illustrated in graph 700, the desired magnetic structure can be designed to meet the required magnetic force. This graph illustrates the advantage of using an array of small magnets instead of one large magnet. But it should be noted that in some embodiments, a single large magnet may be capable of developing sufficient normal force between the magnet and the stiffener or other passive attractor to meet design requirements. Therefore, the teachings of the present specification should not be understood to limit or to exclude an embodiment in which a single large magnet is used instead of an array of smaller magnets.

Figure 8:
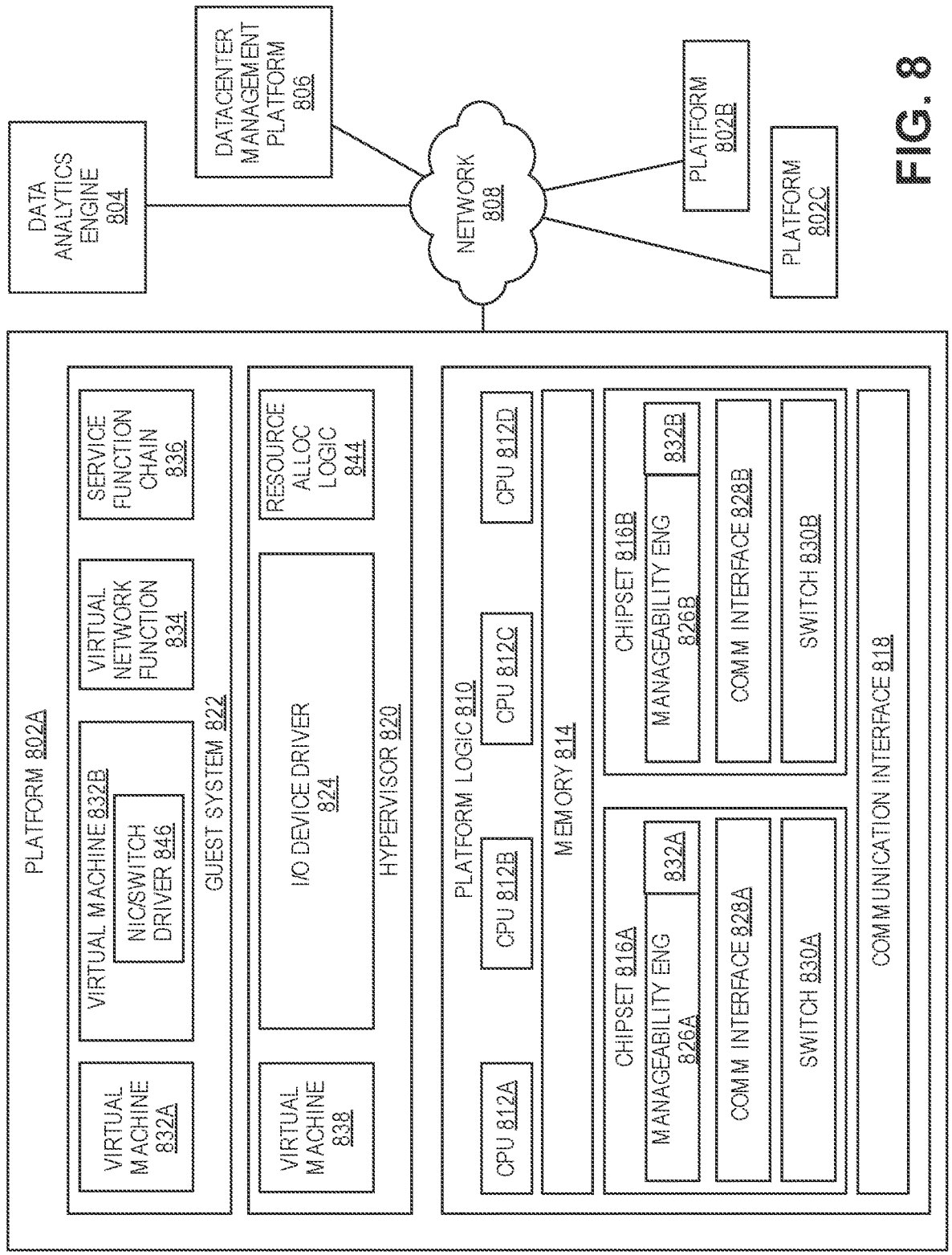
FIG. 8 is a block diagram of a computing platform.

FIG. 8 is a block diagram of components of a computing platform 802A. Embodiments of computing platform 802A disclosed herein may be adapted or configured to provide a magnetically affixed heat spreader, according to the teachings of the present specification.

In the embodiment depicted, hardware platforms 802A, 802B, and 802C, along with a data center management platform 806 and data analytics engine 804 are interconnected via network 808. In other embodiments, a computer system may include any suitable number of (i.e., one or more) platforms, including hardware, software, firmware, and other components. In some embodiments (e.g., when a computer system only includes a single platform), all or a portion of the system management platform 806 may be included on a platform 802. A platform 802 may include platform logic 810 with one or more central processing units (CPUs) 812, memories 814 (which may include any number of different modules), chipsets 816, communication interfaces 818, and any other suitable hardware and/or software to execute a hypervisor 820 or other operating system capable of executing workloads associated with applications running on platform 802. In some embodiments, a platform 802 may function as a host platform for one or more guest systems 822 that invoke these applications. Platform 802A may represent any suitable computing environment, such as a high-performance computing environment, a data center, a communications service provider infrastructure (e.g., one or more portions of an Evolved Packet Core), an in-memory computing environment, a computing system of a vehicle (e.g., an automobile or airplane), an Internet of Things environment, an industrial control system, other computing environment, or combination thereof.

In various embodiments of the present disclosure, accumulated stress and/or rates of stress accumulated of a plurality of hardware resources (e.g., cores and uncores) are monitored and entities (e.g., system management platform 806, hypervisor 820, or other operating system) of computer platform 802A may assign hardware resources of platform logic 810 to perform workloads in accordance with the stress information. In some embodiments, self-diagnostic capabilities may be combined with the stress monitoring to more accurately determine the health of the hardware resources. Each platform 802 may include platform logic 810. Platform logic 810 comprises, among other logic enabling the functionality of platform 802, one or more CPUs 812, memory 814, one or more chipsets 816, and communication interfaces 828. Although three platforms are illustrated, computer platform 802A may be interconnected with any suitable number of platforms. In various embodiments, a platform 802 may reside on a circuit board that is installed in a chassis, rack, or other suitable structure that comprises multiple platforms coupled together through network 808 (which may comprise, e.g., a rack or backplane switch).

CPUs 812 may each comprise any suitable number of processor cores and supporting logic (e.g., uncores). The cores may be coupled to each other, to memory 814, to at least one chipset 816, and/or to a communication interface 818, through one or more controllers residing on CPU 812 and/or chipset 816. In particular embodiments, a CPU 812 is embodied within a socket that is permanently or removably coupled to platform 802A. Although four CPUs are shown, a platform 802 may include any suitable number of CPUs.

Memory 814 may comprise any form of volatile or non-volatile memory including, without limitation, magnetic media (e.g., one or more tape drives), optical media, random access memory (RAM), read-only memory (ROM), flash memory, removable media, or any other suitable local or remote memory component or components. Memory 814 may be used for short, medium, and/or long-term storage by platform 802A. Memory 814 may store any suitable data or information utilized by platform logic 810, including software embedded in a computer-readable medium, and/or encoded logic incorporated in hardware or otherwise stored (e.g., firmware). Memory 814 may store data that is used by cores of CPUs 812. In some embodiments, memory 814 may also comprise storage for instructions that may be executed by the cores of CPUs 812 or other processing elements (e.g., logic resident on chipsets 816) to provide functionality associated with the manageability engine 826 or other components of platform logic 810. A platform 802 may also include one or more chipsets 816 comprising any suitable logic to support the operation of the CPUs 812. In various embodiments, chipset 816 may reside on the same die or package as a CPU 812 or on one or more different dies or packages. Each chipset may support any suitable number of CPUs 812. A chipset 816 may also include one or more controllers to couple other components of platform logic 810 (e.g., communication interface 818 or memory 814) to one or more CPUs. In the embodiment depicted, each chipset 816 also includes a manageability engine 826. Manageability engine 826 may include any suitable logic to support the operation of chipset 816. In a particular embodiment, a manageability engine 826 (which may also be referred to as an innovation engine) is capable of collecting real-time telemetry data from the chipset 816, the CPU(s) 812 and/or memory 814 managed by the chipset 816, other components of platform logic 810, and/or various connections between components of platform logic 810. In various embodiments, the telemetry data collected includes the stress information described herein.

In various embodiments, a manageability engine 826 operates as an out-of-band asynchronous compute agent which is capable of interfacing with the various elements of platform logic 810 to collect telemetry data with no or minimal disruption to running processes on CPUs 812. For example, manageability engine 826 may comprise a dedicated processing element (e.g., a processor, controller, or other logic) on chipset 816, which provides the functionality of manageability engine 826 (e.g., by executing software instructions), thus conserving processing cycles of CPUs 812 for operations associated with the workloads performed by the platform logic 810. Moreover the dedicated logic for the manageability engine 826 may operate asynchronously with respect to the CPUs 812 and may gather at least some of the telemetry data without increasing the load on the CPUs.

A manageability engine 826 may process telemetry data it collects (specific examples of the processing of stress information are provided herein). In various embodiments, manageability engine 826 reports the data it collects and/or the results of its processing to other elements in the computer system, such as one or more hypervisors 820 or other operating systems and/or system management software (which may run on any suitable logic such as system management platform 806). In particular embodiments, a critical event such as a core that has accumulated an excessive amount of stress may be reported prior to the normal interval for reporting telemetry data (e.g., a notification may be sent immediately upon detection).

Additionally, manageability engine 826 may include programmable code configurable to set which CPU(s) 812 a particular chipset 816 manages and/or which telemetry data may be collected.

Chipsets 816 also each include a communication interface 828. Communication interface 828 may be used for the communication of signaling and/or data between chipset 816 and one or more I/O devices, one or more networks 808, and/or one or more devices coupled to network 808 (e.g., system management platform 806). For example, communication interface 828 may be used to send and receive network traffic such as data packets. In a particular embodiment, a communication interface 828 comprises one or more physical network interface controllers (NICs), also known as network interface cards or network adapters. A NIC may include electronic circuitry to communicate using any suitable physical layer and data link layer standard such as Ethernet (e.g., as defined by a IEEE 802.3 standard), Fibre Channel, InfiniBand, Wi-Fi, or other suitable standard. A NIC may include one or more physical ports that may couple to a cable (e.g., an Ethernet cable). A NIC may enable communication between any suitable element of chipset 816 (e.g., manageability engine 826 or switch 830) and another device coupled to network 808. In various embodiments a NIC may be integrated with the chipset (i.e., may be on the same integrated circuit or circuit board as the rest of the chipset logic) or may be on a different integrated circuit or circuit board that is electromechanically coupled to the chipset.

In particular embodiments, communication interfaces 828 may allow communication of data (e.g., between the manageability engine 826 and the data center management platform 806) associated with management and monitoring functions performed by manageability engine 826. In various embodiments, manageability engine 826 may utilize elements (e.g., one or more NICs) of communication interfaces 828 to report the telemetry data (e.g., to system management platform 806) in order to reserve usage of NICs of communication interface 818 for operations associated with workloads performed by platform logic 810.

Switches 830 may couple to various ports (e.g., provided by NICs) of communication interface 828 and may switch data between these ports and various components of chipset 816 (e.g., one or more Peripheral Component Interconnect Express (PCIe) lanes coupled to CPUs 812). Switches 830 may be a physical or virtual (i.e., software) switch.

Platform logic 810 may include an additional communication interface 818. Similar to communication interfaces 828, communication interfaces 818 may be used for the communication of signaling and/or data between platform logic 810 and one or more networks 808 and one or more devices coupled to the network 808. For example, communication interface 818 may be used to send and receive network traffic such as data packets. In a particular embodiment, communication interfaces 818 comprise one or more physical NICs. These NICs may enable communication between any suitable element of platform logic 810 (e.g., CPUs 812 or memory 814) and another device coupled to network 808 (e.g., elements of other platforms or remote computing devices coupled to network 808 through one or more networks).

Platform logic 810 may receive and perform any suitable types of workloads. A workload may include any request to utilize one or more resources of platform logic 810, such as one or more cores or associated logic. For example, a workload may comprise a request to instantiate a software component, such as an I/O device driver 824 or guest system 822; a request to process a network packet received from a virtual machine 832 or device external to platform 802A (such as a network node coupled to network 808); a request to execute a process or thread associated with a guest system 822, an application running on platform 802A, a hypervisor 820 or other operating system running on platform 802A; or other suitable processing request.

A virtual machine 832 may emulate a computer system with its own dedicated hardware. A virtual machine 832 may run a guest operating system on top of the hypervisor 820. The components of platform logic 810 (e.g., CPUs 812, memory 814, chipset 816, and communication interface 818) may be virtualized such that it appears to the guest operating system that the virtual machine 832 has its own dedicated components.

A virtual machine 832 may include a virtualized NIC (vNIC), which is used by the virtual machine as its network interface. A vNIC may be assigned a media access control (MAC) address or other identifier, thus allowing multiple virtual machines 832 to be individually addressable in a network.

VNF 834 may comprise a software implementation of a functional building block with defined interfaces and behavior that can be deployed in a virtualized infrastructure. In particular embodiments, a VNF 834 may include one or more virtual machines 832 that collectively provide specific functionalities (e.g., WAN optimization, virtual private network (VPN) termination, firewall operations, load balancing operations, security functions, etcetera). A VNF 834 running on platform logic 810 may provide the same functionality as traditional network components implemented through dedicated hardware. For example, a VNF 834 may include components to perform any suitable network function virtualization (NFV) workloads, such as virtualized evolved packet core (vEPC) components, mobility management entities, 3rd Generation Partnership Project (3GPP) control and data plane components, etc.

SFC 836 is a group of VNFs 834 organized as a chain to perform a series of operations, such as network packet processing operations. Service function chaining may provide the ability to define an ordered list of network services (e.g. firewalls, load balancers) that are stitched together in the network to create a service chain.

A hypervisor 820 (also known as a virtual machine monitor) may comprise logic to create and run guest systems 822. The hypervisor 820 may present guest operating systems run by virtual machines with a virtual operating platform (i.e., it appears to the virtual machines that they are running on separate physical nodes when they are actually consolidated onto a single hardware platform) and manage the execution of the guest operating systems by platform logic 810. Services of hypervisor 820 may be provided by virtualizing in software or through hardware assisted resources that require minimal software intervention, or both. Multiple instances of a variety of guest operating systems may be managed by the hypervisor 820. Each platform 802 may have a separate instantiation of a hypervisor 820.

Hypervisor 820 may be a native or bare metal hypervisor that runs directly on platform logic 810 to control the platform logic and manage the guest operating systems. Alternatively, hypervisor 820 may be a hosted hypervisor that runs on a host operating system and abstracts the guest operating systems from the host operating system. Hypervisor 820 may include a virtual switch 838 that may provide virtual switching and/or routing functions to virtual machines of guest systems 822. The virtual switch 838 may comprise a logical switching fabric that couples the vNICs of the virtual machines 832 to each other, thus creating a virtual network through which virtual machines may communicate with each other.

Virtual switch 838 may comprise a software element that is executed using components of platform logic 810. In various embodiments, hypervisor 820 may be in communication with any suitable entity (e.g., a software-defined network controller) which may cause hypervisor 820 to reconfigure the parameters of virtual switch 838 in response to changing conditions in platform 802 (e.g., the addition or deletion of virtual machines 832 or identification of optimizations that may be made to enhance performance of the platform).

Hypervisor 820 may also include resource allocation logic 844, which may include logic for determining allocation of platform resources based on the telemetry data (which may include stress information). Resource allocation logic 844 may also include logic for communicating with various components of platform logic 810 entities of platform 802A to implement such optimization, such as components of platform logic 810.

Any suitable logic may make one or more of these optimization decisions. For example, system management platform 806; resource allocation logic 844 of hypervisor 820 or other operating system; or other logic of computer platform 802A may be capable of making such decisions. In various embodiments, the system management platform 806 may receive telemetry data from and manage workload placement across multiple platforms 802. The system management platform 806 may communicate with hypervisors 820 (e.g., in an out-of-band manner) or other operating systems of the various platforms 802 to implement workload placements directed by the system management platform.

The elements of platform logic 810 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, or a Gunning transceiver logic (GTL) bus.

Elements of the computer platform 802A may be coupled together in any suitable manner such as through one or more networks 808. A network 808 may be any suitable network or combination of one or more networks operating using one or more suitable networking protocols. A network may represent a series of nodes, points, and interconnected communication paths for receiving and transmitting packets of information that propagate through a communication system. For example, a network may include one or more firewalls, routers, switches, security appliances, antivirus servers, or other useful network devices.

Figure 9:
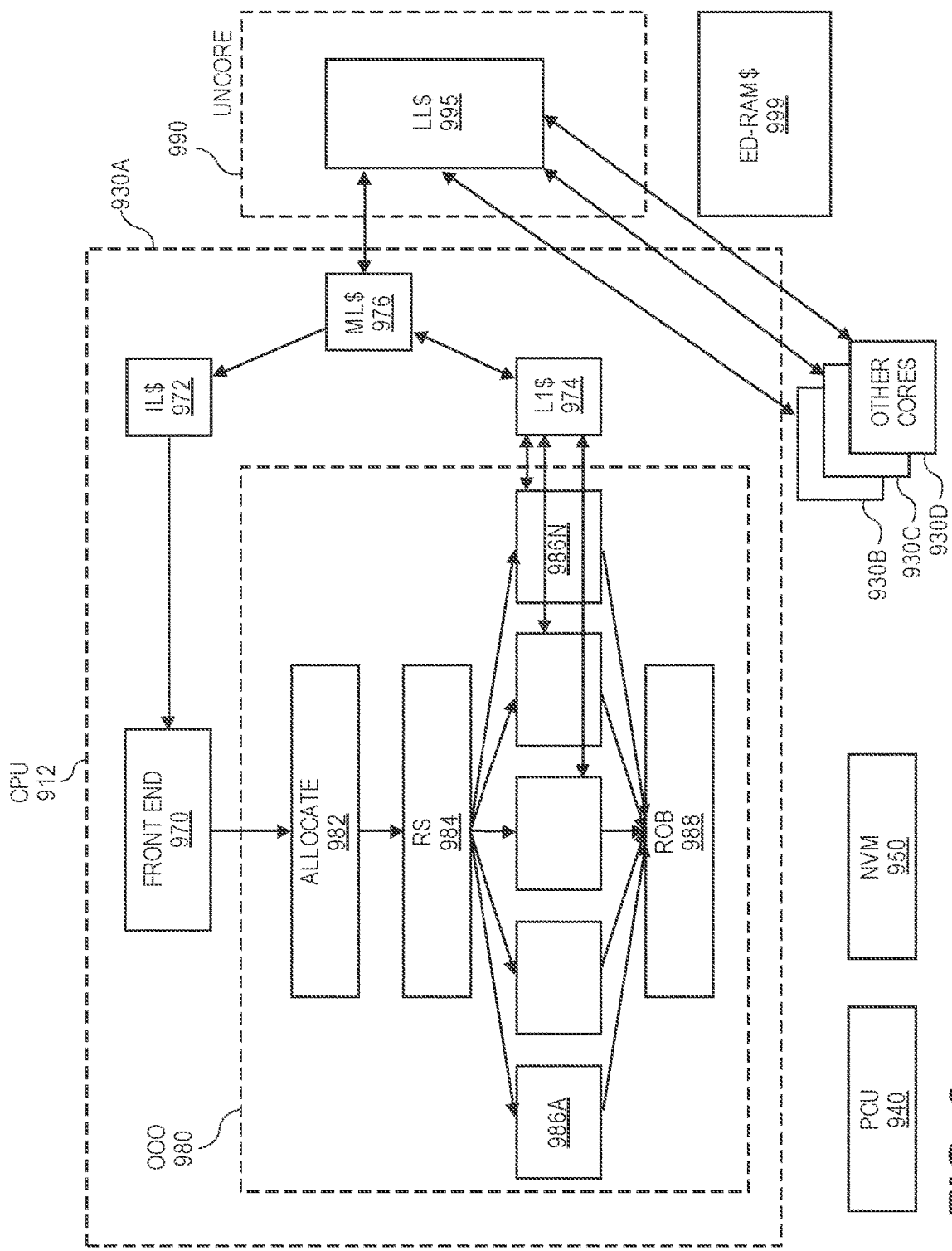
FIG. 9 is a block diagram illustrating elements of a CPU.

FIG. 9 is a block diagram illustrating elements of a CPU 912. Embodiments of CPU 912 disclosed herein may be adapted or configured to provide a magnetically affixed heat spreader, according to the teachings of the present specification.

Although CPU 912 depicts a particular configuration, the cores and other components of CPU 912 may be arranged in any suitable manner. CPU 912 may comprise any processor or processing device, such as a microprocessor, an embedded processor, a digital signal processor (DSP), a network processor, an application processor, a co-processor, an SoC, or other device to execute code. CPU 912, in the depicted embodiment, includes four processing elements (cores 930 in the depicted embodiment), which may include asymmetric processing elements or symmetric processing elements. However, CPU 912 may include any number of processing elements that may be symmetric or asymmetric.

Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. A physical CPU may include any suitable number of cores. In various embodiments, cores may include one or more out-of-order processor cores or one or more in-order processor cores. However, cores may be individually selected from any type of core, such as a native core, a software managed core, a core adapted to execute a native instruction set architecture (ISA), a core adapted to execute a translated ISA, a co-designed core, or other known core. In a heterogeneous core environment (i.e. asymmetric cores), some form of translation, such as binary translation, may be utilized to schedule or execute code on one or both cores.

In the embodiment depicted, core 930A includes an out-of-order processor that has a front end unit 970 used to fetch incoming instructions, perform various processing (e.g. caching, decoding, branch predicting, etc.) and passing instructions/operations along to an out-of-order (OOO) engine. The OOO engine performs further processing on decoded instructions.

A front end 970 may include a decode module coupled to fetch logic to decode fetched elements. Fetch logic, in one embodiment, includes individual sequencers associated with thread slots of cores 930. Usually a core 930 is associated with a first ISA, which defines/specifies instructions executable on core 930. Often machine code instructions that are part of the first ISA include a portion of the instruction (referred to as an opcode), which references/specifies an instruction or operation to be performed. The decode module may include circuitry that recognizes these instructions from their opcodes and passes the decoded instructions on in the pipeline for processing as defined by the first ISA. Decoders of cores 930, in one embodiment, recognize the same ISA (or a subset thereof). Alternatively, in a heterogeneous core environment, a decoder of one or more cores (e.g., core 930B) may recognize a second ISA (either a subset of the first ISA or a distinct ISA).

In the embodiment depicted, the OOO engine includes an allocate unit 982 to receive decoded instructions, which may be in the form of one or more micro-instructions or uops, from front end unit 970, and allocate them to appropriate resources such as registers and so forth. Next, the instructions are provided to a reservation station 984, which reserves resources and schedules them for execution on one of a plurality of execution units 986A-986N. Various types of execution units may be present, including, for example, arithmetic logic units (ALUs), load and store units, vector processing units (VPUs), floating point execution units, among others. Results from these different execution units are provided to a reorder buffer (ROB) 988, which take unordered results and return them to correct program order.

In the embodiment depicted, both front end unit 970 and OOO engine 980 are coupled to different levels of a memory hierarchy. This memory hierarchy may include various levels of cache. The cache is a fast memory structure that is often multilayered. In common practice, cache is much faster than main memory (often two to three orders of magnitude faster), and includes cache ways that map to address spaces within main memory. Cache design may be driven by the principle that faster is generally more expensive, and larger is generally slower. Thus, in some cases, cache is divided into multiple levels. For example, a small, very fast, and relatively expensive level 1 (L1) cache may service an individual core. A larger, somewhat less expensive, but also slower layer 2 (L2) cache may service a plurality of cores within the same CPU socket. An even larger, slower, and less expensive layer 3 (L3) cache (also known as "last level cache" (LLC)) may be located on the motherboard, and may service multiple CPU sockets within the same system. These are illustrated as nonlimiting examples only, and it should be understood that other cache configurations are also possible.

Specifically shown is an instruction level cache 972, that in turn couples to a mid-level cache 976, that in turn couples to a last level cache 995. In one embodiment, last level cache 995 is implemented in an on-chip (sometimes referred to as uncore) unit 990. Uncore 990 may communicate with system memory 999, which, in the illustrated embodiment, is implemented via embedded DRAM (eDRAM). The various execution units 986 within OOO engine 980 are in communication with a first level cache 974 that also is in communication with mid-level cache 976. Additional cores 930B-930D may couple to last level cache 995 as well. L1 is on the individual core, L2 services multiple cores, and L3 is on the motherboard.

In particular embodiments, uncore 990 may be in a voltage domain and/or a frequency domain that is separate from voltage domains and/or frequency domains of the cores. That is, uncore 990 may be powered by a supply voltage that is different from the supply voltages used to power the cores and/or may operate at a frequency that is different from the operating frequencies of the cores.

CPU 912 may also include a power control unit (PCU) 940. In various embodiments, PCU 940 may control the supply voltages and the operating frequencies applied to each of the cores (on a per-core basis) and to the uncore. PCU 940 may also instruct a core or uncore to enter an idle state (where no voltage and clock are supplied) when not performing a workload.

In various embodiments, PCU 940 may detect one or more stress characteristics of a hardware resource, such as the cores and the uncore. A stress characteristic may comprise an indication of an amount of stress that is being placed on the hardware resource. As examples, a stress characteristic may be a voltage or frequency applied to the hardware resource; a power level, current level, or voltage level sensed at the hardware resource; a temperature sensed at the hardware resource; or other suitable measurement. In various embodiments, multiple measurements (e.g., at different locations) of a particular stress characteristic may be performed when sensing the stress characteristic at a particular instance of time. In various embodiments, PCU 940 may detect stress characteristics at any suitable interval.

In various embodiments, PCU 940 is a component that is discrete from the cores 930. In particular embodiments, PCU 940 runs at a clock frequency that is different from the clock frequencies used by cores 930. In some embodiments where the PCU is a microcontroller, PCU 940 executes instructions according to an ISA that is different from an ISA used by cores 930.

In various embodiments, CPU 912 may also include a non-volatile memory 950 to store stress information (such as stress characteristics, incremental stress values, accumulated stress values, stress accumulation rates, or other stress information) associated with cores 930 or uncore 990, such that when power is lost, the stress information is maintained.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present specification.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

In the foregoing description, certain aspects of some or all embodiments are described in greater detail than is strictly necessary for practicing the appended claims. These details are provided by way of nonlimiting example only, for the purpose of providing context and illustration of the disclosed embodiments. Such details should not be understood to be required, and should not be "read into" the claims as limitations. The phrase may refer to "an embodiment" or "embodiments." These phrases, and any other references to embodiments, should be understood broadly to refer to any combination of one or more embodiments. Furthermore, the several features disclosed in a particular "embodiment" could just as well be spread across multiple embodiments. For example, if features 1 and 2 are disclosed in "an embodiment," embodiment A may have feature 1 but lack feature 2, while embodiment B may have feature 2 but lack feature 1.

This specification may provide illustrations in a block diagram format, wherein certain features are disclosed in separate blocks. These should be understood broadly to disclose how various features interoperate, but are not intended to imply that those features must necessarily be embodied in separate hardware or software. Furthermore, where a single block discloses more than one feature in the same block, those features need not necessarily be embodied in the same hardware and/or software. For example, a computer "memory" could in some circumstances be distributed or mapped between multiple levels of cache or local memory, main memory, battery-backed volatile memory, and various forms of persistent memory such as a hard disk, storage server, optical disk, tape drive, or similar. In certain embodiments, some of the components may be omitted or consolidated. In a general sense, the arrangements depicted in the FIGURES may be more logical in their representations, whereas a physical architecture may include various permutations, combinations, and/or hybrids of these elements. Countless possible design configurations can be used to achieve the operational objectives outlined herein. Accordingly, the associated infrastructure has a myriad of substitute arrangements, design choices, device possibilities, hardware configurations, software implementations, and equipment options.

References may be made herein to a computer-readable medium, which may be a tangible and non-transitory computer-readable medium. As used in this specification and throughout the claims, a "computer-readable medium" should be understood to include one or more computer-readable mediums of the same or different types. A computer-readable medium may include, by way of nonlimiting example, an optical drive (e.g., CD/DVD/Blu-Ray), a hard drive, a solid state drive, a flash memory, or other nonvolatile medium. A computer-readable medium could also include a medium such as a ROM, a field-programmable gate array (FPGA), or an ASIC configured to carry out the desired instructions, stored instructions for programming an FPGA or ASIC to carry out the desired instructions, an intellectual property (IP) block that can be integrated in hardware into other circuits, or instructions encoded directly into hardware or microcode on a processor such as a microprocessor, DSP, microcontroller, or in any other suitable component, device, element, or object where appropriate and based on particular needs. A non-transitory storage medium herein is expressly intended to include any non-transitory special-purpose or programmable hardware configured to provide the disclosed operations, or to cause a processor to perform the disclosed operations.

Various elements may be "communicatively," "electrically," "mechanically," or otherwise "coupled" to one another throughout this specification and the claims. Such coupling may be a direct, point-to-point coupling, or may include intermediary devices. For example, two devices may be communicatively coupled to one another via a controller that facilitates the communication. Devices may be electrically coupled to one another via intermediary devices such as signal boosters, voltage dividers, or buffers. Mechanically coupled devices may be indirectly mechanically coupled.

Any "module" or "engine" disclosed herein may refer to or include software, a software stack, a combination of hardware, firmware, and/or software, a circuit configured to carry out the function of the engine or module, or any computer-readable medium as disclosed above. Such modules or engines may, in appropriate circumstances, be provided on or in conjunction with a hardware platform, which may include hardware compute resources such as a processor, memory, storage, interconnects, networks and network interfaces, accelerators, or other suitable hardware. Such a hardware platform may be provided as a single monolithic device (e.g., in a PC form factor), or with some or part of the function being distributed (e.g., a "composite node" in a high-end data center, where compute, memory, storage, and other resources may be dynamically allocated and need not be local to one another).

There may be disclosed herein flow charts, signal flow diagram, or other illustrations showing operations being performed in a particular order. Unless otherwise expressly noted, or unless required in a particular context, the order should be understood to be a nonlimiting example only. Furthermore, in cases where one operation is shown to follow another, other intervening operations may also occur, which may be related or unrelated. Some operations may also be performed simultaneously or in parallel. In cases where an operation is said to be "based on" or "according to" another item or operation, this should be understood to imply that the operation is based at least partly on or according at least partly to the other item or operation. This should not be construed to imply that the operation is based solely or exclusively on, or solely or exclusively according to the item or operation.

All or part of any hardware element disclosed herein may readily be provided in an SoC, including a CPU package. An SoC represents an integrated circuit (IC) that integrates components of a computer or other electronic system into a single chip. Thus, for example, client devices or server devices may be provided, in whole or in part, in an SoC. The SoC may contain digital, analog, mixed-signal, and radio frequency functions, all of which may be provided on a single chip substrate. Other embodiments may include a multichip module (MCM), with a plurality of chips located within a single electronic package and configured to interact closely with each other through the electronic package.

In a general sense, any suitably-configured circuit or processor can execute any type of instructions associated with the data to achieve the operations detailed herein. Any processor disclosed herein could transform an element or an article (for example, data) from one state or thing to another state or thing. Furthermore, the information being tracked, sent, received, or stored in a processor could be provided in any database, register, table, cache, queue, control list, or storage structure, based on particular needs and implementations, all of which could be referenced in any suitable timeframe. Any of the memory or storage elements disclosed herein, should be construed as being encompassed within the broad terms "memory" and "storage," as appropriate.

Computer program logic implementing all or part of the functionality described herein is embodied in various forms, including, but in no way limited to, a source code form, a computer executable form, machine instructions or microcode, programmable hardware, and various intermediate forms (for example, forms generated by an assembler, compiler, linker, or locator). In an example, source code includes a series of computer program instructions implemented in various programming languages, such as an object code, an assembly language, or a high level language such as OpenCL, FORTRAN, C, C++, JAVA, or HTML for use with various operating systems or operating environments, or in hardware description languages such as Spice, Verilog, and VHDL. The source code may define and use various data structures and communication messages. The source code may be in a computer executable form (e.g., via an interpreter), or the source code may be converted (e.g., via a translator, assembler, or compiler) into a computer executable form, or converted to an intermediate form such as byte code. Where appropriate, any of the foregoing may be used to build or describe appropriate discrete or integrated circuits, whether sequential, combinatorial, state machines, or otherwise.

In one example embodiment, any number of electrical circuits of the FIGURES may be implemented on a board of an associated electronic device. The board can be a general circuit board that can hold various components of the internal electronic system of the electronic device and, further, provide connectors for other peripherals. Any suitable processor and memory can be suitably coupled to the board based on particular configuration needs, processing demands, and computing designs. Note that with the numerous examples provided herein, interaction may be described in terms of two, three, four, or more electrical components. However, this has been done for purposes of clarity and example only. It should be appreciated that the system can be consolidated or reconfigured in any suitable manner. Along similar design alternatives, any of the illustrated components, modules, and elements of the FIGURES may be combined in various possible configurations, all of which are within the broad scope of this specification.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 (pre-AIA) or paragraph (f) of the same section (post-AIA), as it exists on the date of the filing hereof unless the words "means for" or "steps for" are specifically used in the particular claims; and (b) does not intend, by any statement in the specification, to limit this disclosure in any way that is not otherwise expressly reflected in the appended claims.

EXAMPLE IMPLEMENTATIONS

The following examples are provided by way of illustration.

Example 1 includes a computing apparatus, comprising: an active computing element; a first magnetic attractor mechanically coupled to the active computing element; and a cold plate disposed to conduct heat away from the active computing element, the cold plate comprising a second magnetic attractor disposed to magnetically couple with the first magnetic attractor.

Example 2 includes the computing apparatus of example 1, wherein the second magnetic attractor comprises an array of magnets having a magnet aspect ratio greater than approximately 0.1.

Example 3 includes the computing apparatus of example 2, wherein the magnets have a magnet aspect ratio of approximately 0.5.

Example 4 includes the computing apparatus of example 1, wherein the cold plate has dimensions substantially similar to the active computing element.

Example 5 includes the computing apparatus of example 1, wherein the first magnetic attractor comprises a passively magnetic mechanical stiffener Example 6 includes the computing apparatus of example 5, wherein the mechanical stiffener comprises steel 1008.

Example 7 includes the computing apparatus of example 5, wherein the mechanical stiffener has outer dimension substantially similar to dimensions of the active computing element, and a peripheral thickness of approximately 5 millimeters (mm).

Example 8 includes the computing apparatus of example 5, wherein the second magnetic attractor comprises an array of magnets having a magnet aspect ratio of approximately 0.5, and wherein the mechanical stiffener includes surface irregularities, wherein up to 20% of the magnets have a separation from the mechanical stiffener of up to 100 micrometers.

Example 9 includes the computing apparatus of example 1, further comprising a heat pipe to conduct heat away from the cold plate toward an ambient environment.

Example 10 includes the computing apparatus of example 1, wherein the active element is a CPU Example 11 includes the computing apparatus of example 1, wherein the active element is a system on a chip.

Example 12 includes the computing apparatus of example 1, wherein the second magnetic attractor comprises an array of neodymium magnets of dimensions approximately 2 mm by 2 mm and 1 mm thick.

Example 13 includes an apparatus, comprising: a heat source comprising a first magnetic attractor; a heat conductor configured to conduct heat from the heat source to an ambient environment, the heat conductor comprising a second magnetic attractor and having length and width substantially matching a length and width of the heat source, wherein the heat conductor is disposed to mechanically couple to the electrical heat source substantially via magnetic attraction between the first magnetic attractor and the second magnetic attractor.

Example 14 includes the apparatus of example 13, wherein the second magnetic attractor comprises an array of magnets having a magnet aspect ratio greater than approximately 0.1.

Example 15 includes the apparatus of example 14, wherein the magnets have a magnet aspect ratio of approximately 0.5.

Example 16 includes the apparatus of example 13, wherein the first magnetic is passively magnetic.

Example 17 includes the apparatus of example 13, wherein the first magnetic attractor is actively magnetic.

Example 18 includes the apparatus of example 13, further comprising a heat pipe to conduct heat to the ambient environment.

Example 19 includes the apparatus of example 13, wherein the heat source is an electronic element.

Example 20 includes the apparatus of example 19, wherein the electronic element comprises a processor.

Example 21 includes the apparatus of example 19, wherein the electronic element comprises a system on a chip.

Example 22 includes the apparatus of example 13, wherein the second magnetic attractor comprises a two-column array of neodymium magnets around a periphery of the heat conductor.

Example 23 includes a heat spreader, comprising: a heat conductive surface configured to mechanically couple to a heat source; and a first magnetic attractor disposed around a periphery of the heat spreader to magnetically couple to a second magnetic attractor of the heat source.

Example 24 includes the heat spreader of example 23, wherein the first magnetic attractor comprises an array of magnets having a magnet aspect ratio greater than approximately 0.1.

Example 25 includes the heat spreader of example 24, wherein the magnets have a magnet aspect ratio of approximately 0.5.

Example 26 includes the heat spreader of example 23, wherein the first magnetic attractor is actively magnetic.

Example 27 includes the heat spreader of example 23, wherein the first magnetic attractor is passively magnetic.

Example 28 includes the heat spreader of example 23, wherein the heat conductive surface has dimensions of approximately 32 millimeters by 44 millimeters.

Example 29 includes the heat spreader of example 23, further comprising a heat pipe to conduct heat away from the cold pipe toward an ambient environment.

Example 30 includes the heat spreader of example 23, wherein the first magnetic attractor comprises an array of neodymium magnets of dimensions approximately 2 mm by 2 mm and 1 mm thick.

Example 31 includes the heat spreader of example 30, wherein the array of magnets comprises a two-column array disposed around a periphery of the heat spreader.

What is claimed is:

1. A computing apparatus, comprising:
   an active computing element;
   a magnetically attractive mechanical stiffener affixed to a top surface of the active computing element; and
   a cold plate disposed to conduct heat away from the active computing element, the cold plate comprising a plurality of magnets disposed around a full periphery of the cold plate and disposed magnetically couple with the magnetically attractive mechanical stiffener.

2. The computing apparatus of claim 1, wherein the plurality of magnets has a magnet aspect ratio greater than approximately 0.1.

3. The computing apparatus of claim 2, wherein the plurality of magnets has a magnet aspect ratio of approximately 0.5.

4. The computing apparatus of claim 1, wherein the cold plate has dimensions substantially similar to the active computing element.

5. The computing apparatus of claim 1, wherein the magnetically attractive mechanical stiffener comprises a magnetically-attractive metal.

6. The computing apparatus of claim 5, wherein the magnetically attractive mechanical stiffener comprises steel 1008.

7. The computing apparatus of claim 5, wherein the magnetically attractive mechanical stiffener has outer dimension substantially similar to dimensions of the active computing element, and a peripheral thickness of approximately 5 millimeters (mm).

8. The computing apparatus of claim 5, wherein the plurality of magnets has a magnet aspect ratio of approximately 0.5, and wherein the mechanical stiffener includes surface irregularities, wherein up to 20% of the plurality of magnets has a separation from the mechanical stiffener of up to 100 micrometers.

9. The computing apparatus of claim 1, further comprising a heat pipe to conduct heat away from the cold plate toward an ambient environment.

10. The computing apparatus of claim 1, wherein the active computing element is a CPU.

11. The computing apparatus of claim 1, wherein the active computing element is a system on a chip.

12. The computing apparatus of claim 1, wherein the plurality of magnets comprises an array of neodymium magnets of dimensions approximately 2 mm by 2 mm and 1 mm thick.

13. An apparatus, comprising:
   a heat source having disposed thereon a mechanical stiffener disposed peripherally around and attached to a top surface of the heat source; and
   a heat conductor configured to conduct heat from the heat source to an ambient environment, the heat conductor comprising a magnetic attractor having a plurality of magnets, the magnetic attractor having a length and width substantially matching a length and width of the heat source, wherein the heat conductor is disposed to mechanically couple to the heat source substantially via magnetic attraction between the mechanical stiffener and a plurality of magnets disposed around a full periphery of the heat conductor.

14. The apparatus of claim 13, wherein the magnetic attractor has a magnet aspect ratio greater than approximately 0.1.

15. The apparatus of claim 14, wherein the plurality of magnets has a magnet aspect ratio of approximately 0.5.

16. The apparatus of claim 13, wherein the mechanical stiffener is passively magnetic.

17. The apparatus of claim 13, wherein the mechanical stiffener is actively magnetic.

18. The apparatus of claim 13, further comprising a heat pipe to conduct heat to the ambient environment.

19. The apparatus of claim 13, wherein the heat source is an electronic element.

20. The apparatus of claim 19, wherein the electronic element comprises a system on a chip.

21. The apparatus of claim 13, wherein the plurality of magnets comprises a two-column array of neodymium magnets around the full periphery of the heat conductor.

22. A heat spreader, comprising:
   a heat conductive surface configured to mechanically couple to a heat source, and having dimensions to substantially match a top profile of the heat source; and
   a first magnetic attractor disposed around a full periphery of the heat spreader to magnetically couple to a second magnetic attractor of the heat source, the first magnetic attractor comprising a plurality of magnets disposed around the full periphery of the heat spreader.

23. The heat spreader of claim 22, wherein the plurality of magnets of the first magnetic attractor has a magnet aspect ratio greater than approximately 0.1.

24. The heat spreader of claim 23, wherein the plurality of magnets of the first magnetic attractor has a magnet aspect ratio of approximately 0.5.

25. The heat spreader of claim 22, wherein the first magnetic attractor is actively magnetic.

* * * * *